United States Patent
Weber et al.

(10) Patent No.: US 6,735,086 B1
(45) Date of Patent: May 11, 2004

(54) HEAT-CONDUCTING DEVICE FOR CIRCUIT BOARD

(75) Inventors: Richard M. Weber, Prosper, TX (US); Kerrin A. Rummel, Richardson, TX (US); Albert P. Payton, Sachse, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/437,361

(22) Filed: May 13, 2003

(51) Int. Cl.[7] .................................................. H05K 7/20
(52) U.S. Cl. ........................ 361/719; 361/704; 361/707; 361/721; 165/80.2; 165/185
(58) Field of Search ................................ 361/703, 704, 361/707, 719, 721; 174/16.1; 165/80.2, 80.3, 185

(56) References Cited

U.S. PATENT DOCUMENTS

| | | | | |
|---|---|---|---|---|
| 4,442,475 A | * | 4/1984 | Franklin et al. ............ 361/690 |
| 4,858,068 A | * | 8/1989 | Bitller et al. ............... 361/679 |
| 5,060,115 A | * | 10/1991 | Sewell ........................ 361/710 |
| 5,105,337 A | * | 4/1992 | Bitller et al. ............... 361/722 |
| 5,251,099 A | * | 10/1993 | Goss et al. .................. 361/721 |
| 5,284,095 A | * | 2/1994 | Sabah ........................ 102/293 |
| 5,621,617 A | * | 4/1997 | Goss et al. .................. 361/721 |
| 6,119,573 A | * | 9/2000 | Berens et al. .............. 89/1.816 |
| 6,351,383 B1 | | 2/2002 | Payton |
| 6,404,636 B1 | | 6/2002 | Staggers et al. |

* cited by examiner

Primary Examiner—Boris Chervinsky
(74) Attorney, Agent, or Firm—Raytheon Company

(57) ABSTRACT

A heat-conducting device for conducting heat between a circuit board and an airframe of a missile includes a thermal plane onto which the circuit board is mounted, and a pair of feet that partially protrude from the slots in the thermal plane. Slot-engaging portions of the feet freely float within the slots, allowing repositioning of the feet in two dimensions relative to the slots. Resilient devices such as springs urge outer portions of the feet into contact with the airframe. Locking mechanisms may prevent extension of the feet until after the heat-conducting device is installed in the missile. The feet self-align into contact with the airframe, automatically adjusting to compensate for misalignment and/or warping.

20 Claims, 3 Drawing Sheets

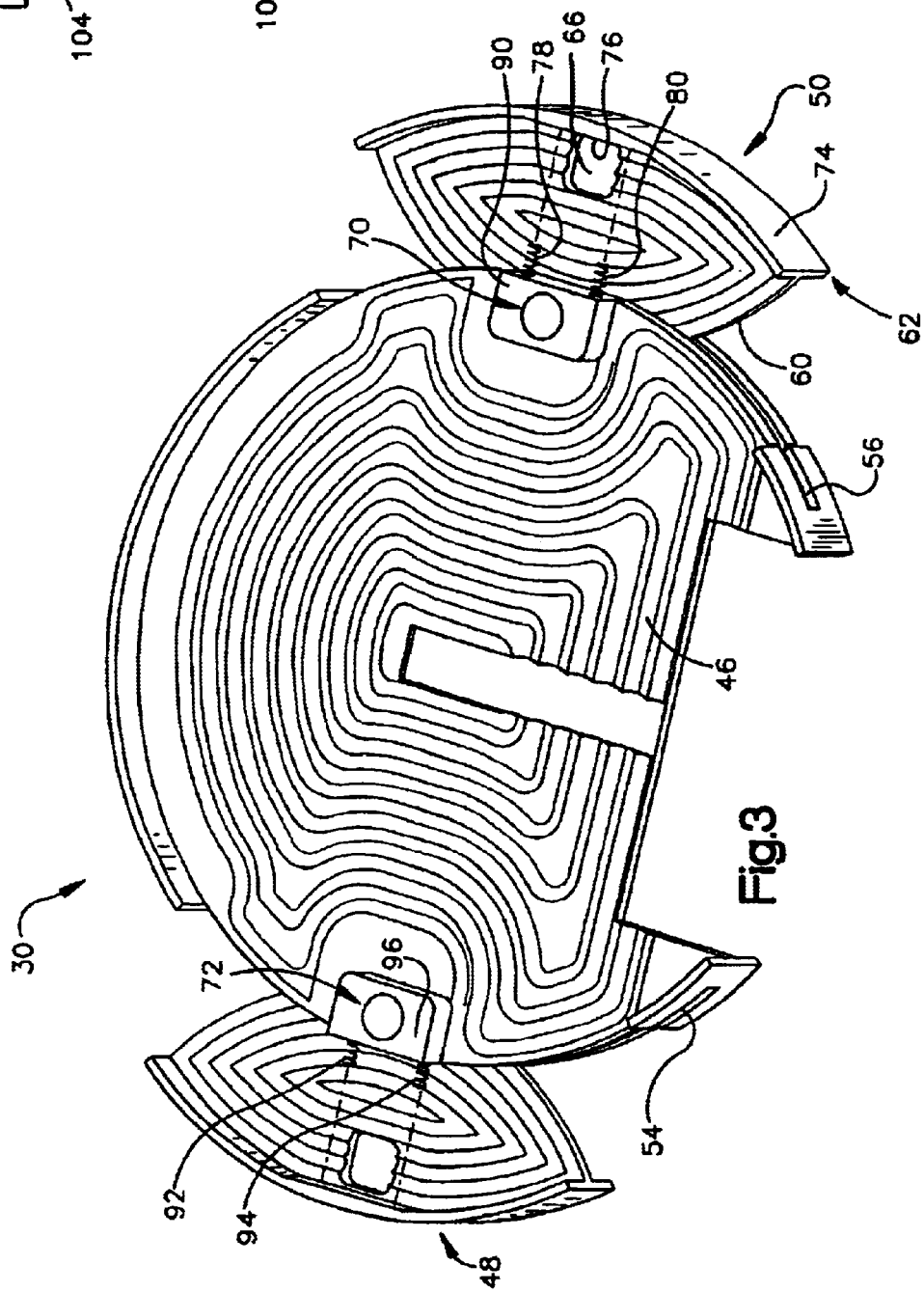

HEAT-CONDUCTING DEVICE FOR CIRCUIT BOARD

TECHNICAL FIELD

This invention relates to heat conducting devices, and more particularly to a heat-conducting device for a circuit board.

BACKGROUND OF THE INVENTION circuit board (CB) located in a missile contains electronics mounted on and through the CB. The electronics themselves generate heat, which must be dissipated through the airframe of the missile.

In many older missiles, the influx of heat during high-speed flight was the primary concern because the electronics did not produce large amounts of heat and flight times were very short. Accordingly, missiles that had short duration high-speed flights were designed to limit the influx of heat during that mode of operation. These designs, however, did not allow for the removal of heat from the missile. Thus, as the electronics have become more complex and have begun to operate for longer periods of time, internal heat has become a concern too. Thus, CBs in some modern missiles may generate significant internal heat that must be rejected to the missile's exterior while operating on the wing of an aircraft and for periods of time after launch when the missile is at low air speeds.

One method of thermally coupling CBs to airframes has been to utilize thin conductive fibers that contact the airframe. One example of such fibers is fibers sold under the trademark VEL-THERM. However, such fibers may at times fracture or otherwise break, raising the possibility of damage by foreign objects within the missile.

From the foregoing it will be appreciated that improvements are possible in the conduction of heat from CBs to airframes.

SUMMARY OF THE INVENTION

According to an aspect of the invention, a heat-conducting device has freely-floating feet that protrude from slots in a thermal plane.

According to another aspect of the invention, a heat-conducting device has airframe engaging portions that are self-positioned in contact with an airframe by resilient devices.

According to yet another aspect of the invention, a heat-conducting device for providing a thermal path between a circuit board and an airframe, includes: a thermal plane able to receive a circuit board; and a foot partially protruding from the thermal plane. The thermal plane has a slot therein for receiving a slot-engaging portion of the foot. The foot is movable relative to the thermal plane, to thereby provide better contact between the foot and the airframe.

According to still another aspect of the invention, a heat-conducting device for providing a thermal path between a circuit board and an airframe, includes: a thermal plane able to receive a circuit board; a pair of feet partially protruding from the thermal plane; and resilient devices between the thermal plane and airframe engaging portions of respective of the feet. The thermal plane has a slots therein for receiving respective slot-engaging portions of the feet. The feet are movable relative to the thermal plane, to thereby provide better contact between the airframe engaging portions and the airframe.

According to a further aspect of the invention, a method of transferring heat from a circuit board to an airframe of a missile, includes the steps of: placing in the missile a heat-conducting device that includes a thermal plane to which the circuit board is attached; and following the placing, contacting the airframe with feet of the heat-conducting device, wherein the feet are thermally coupled to the thermal plane. The contacting includes using resilient devices of the heat-conducting device to push the feet against the airframe.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale,

FIG. 3 is a somewhat exploded view of a heat-conducting devices in accordance with the present invention; and FIG. 4 is a high-level flow chart of a method in accordance with the present invention.

DETAILED DESCRIPTION

A heat-conducting device for conducting heat between a circuit board and an airframe of a missile includes a thermal plane onto which the circuit board is mounted, and a pair of feet that partially protrude from the slots in the thermal plane. Slot-engaging portions of the feet freely float within the slots, allowing re-positioning of the feet in two dimensions relative to the slots. Resilient devices such as springs urge outer portions of the feet into contact with the airframe. Locking mechanisms may prevent extension of the feet until after the heat-conducting device is installed in the missile. The feet self-align into contact with the airframe, automatically adjusting to compensate for misalignment and/or warping.

Figure 1:
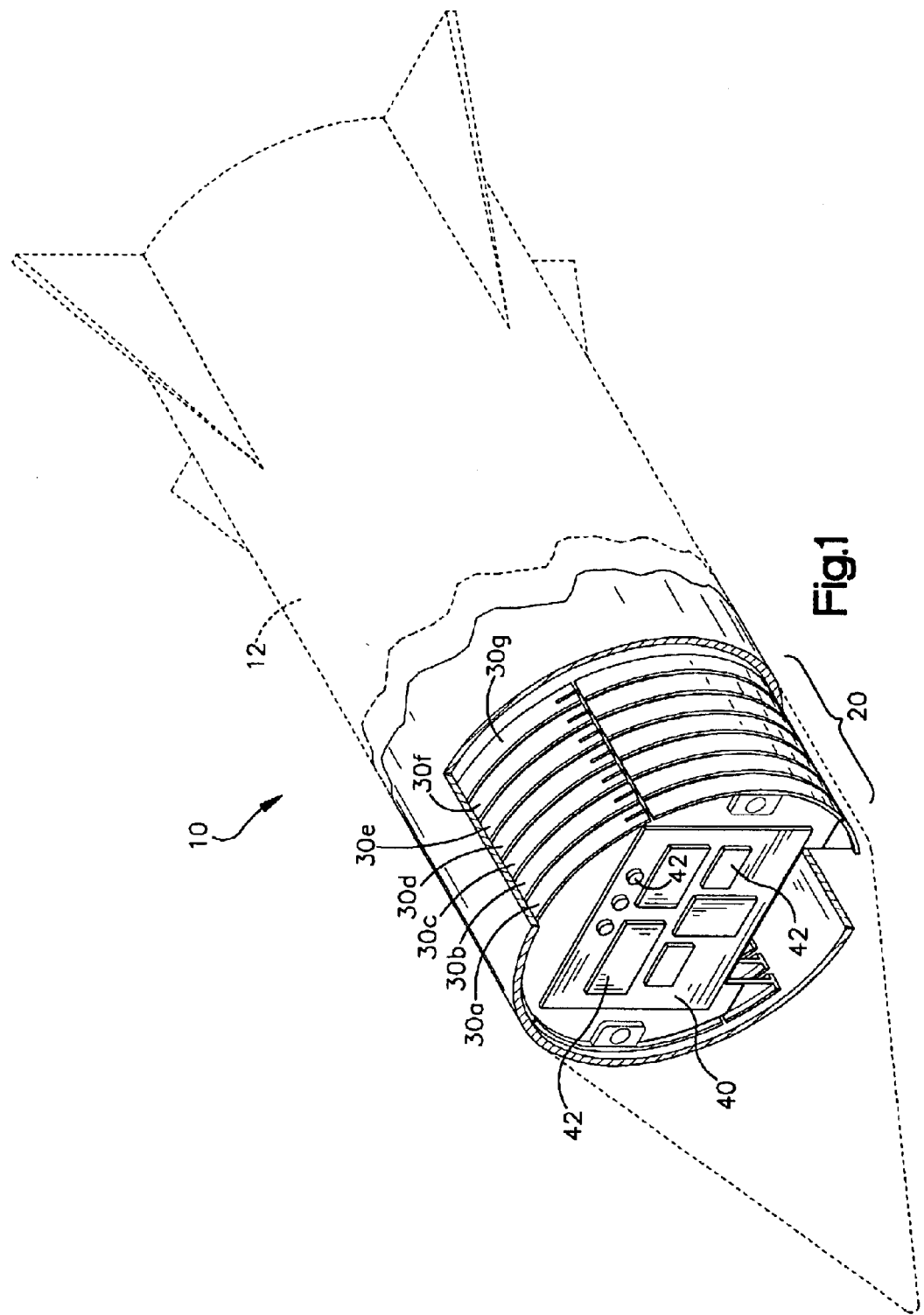
FIG. 1 is an oblique view of a missile utilizing heat-conducting devices in accordance with the present invention.

FIG. 1 shows an assembly 20 of heat-conducting devices 30a, 30b, 30c, 30d, 30e, 30f, and 30g (generally referred to a heat-conducting device 30) mounted in a missile 10. The assembly 20 may in principle have any number of heat-conducting devices 30. A circuit board (CB) 40 mounts onto the heat-conducting device 30 and contains a variety of electronic devices 42, which may include integrated circuits, microprocessors, active radar components, or any other type of suitable electronic device. The CB 40 can be a printed circuit board, a printed wafer board, or any other substrate on which the electronic devices 42 may be mounted and/or interconnected. The CB 40 may be composed of plastic, fiberglass, or composite. In a particular embodiment, the CB 40 is composed of FR-4.

The CB 40 is able to dissipate heat generated by the electronic devices 42 during operation of the missile 10. To accomplish this, the heat-conducting device 30 engages (contacts) the airframe 12. By contacting the airframe 12, the heat-conducting device 30 provides a low impedance thermal path between the CB 40 and the airframe 12 for dissipating heat generated by the electronic devices 42 on the CB 40. The airframe 12 may include the skin of the missile 10, a spar of the missile 10, a bulkhead of the missile 10, or any other structural component of the missile 10 that provides a thermal path to transfer heat generated by the heat-conducting device 30.

In operation, the heat-conducting device 30 is in a disengaged mode, which does not allow for full contact with the airframe 12, during insertion into missile 10. As explained in greater detail below, after insertion and mounting, portions of the heat-conducting device 30 are extended to engage the airframe 12. Engaging the airframe 12 provides a low impedance thermal path for transferring heat generated by the electronic devices 42 on the CB 40 to the airframe 12, where it discharges to the ambient surroundings, such as the atmosphere. Each heat-conducting device 30 in the assembly 20 may be extended to engage and disengage the airframe 12.

In particular embodiments, the heat-conducting device 30 has a shape similar to a lateral cross-section of the airframe 12. This allows for a-uniform design for the heat-conducting device 30 and/or the CB 40. Also, this shape allows the heat-conducting device 30 to mount perpendicular to the longitudinal axis of the airframe 12, which provides a sound structural support for the CB 401

Figure 2:
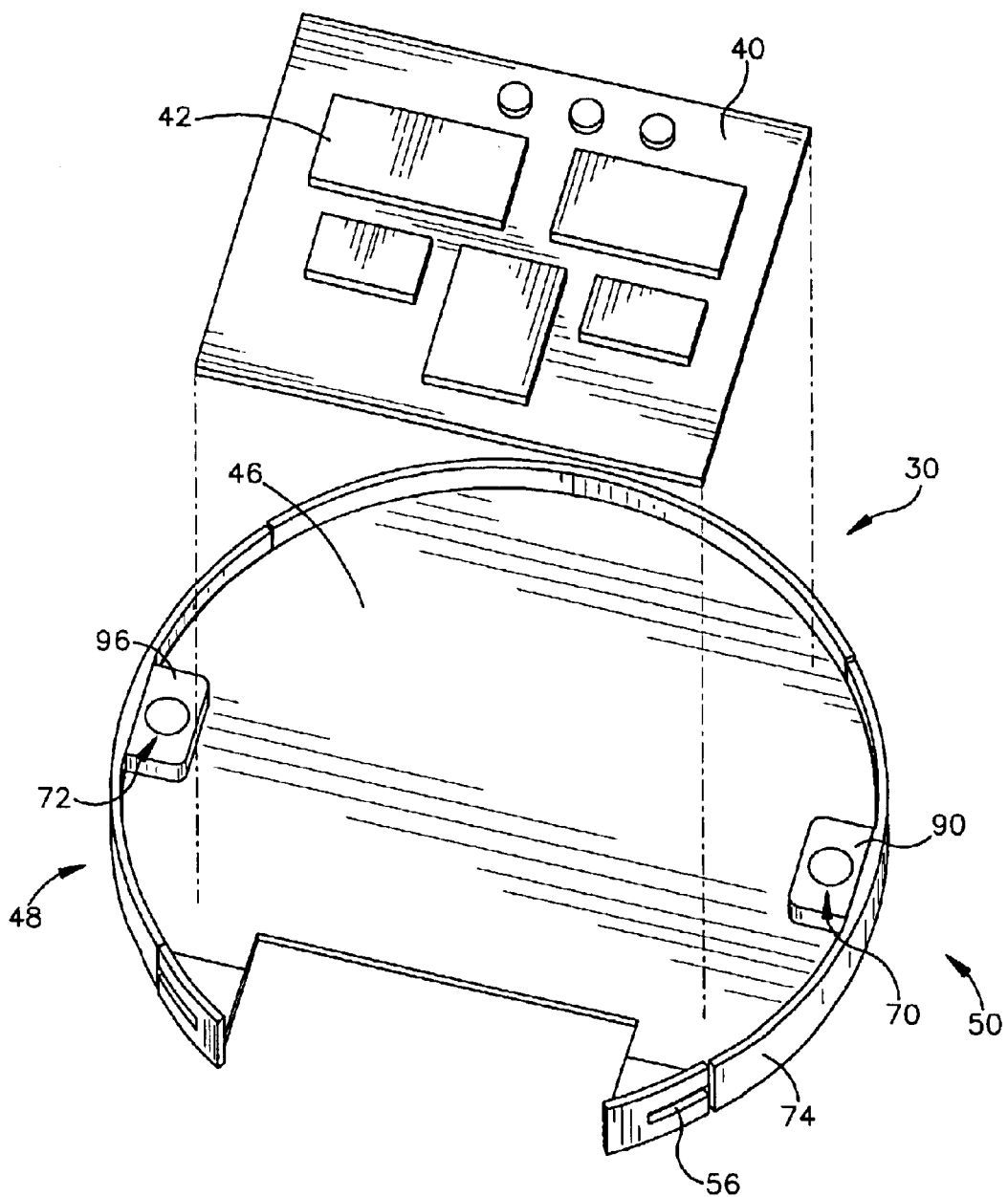
FIG. 2 is an exploded view of showing the coupling of a circuit board and a heat-conducting devices in accordance with the present invention.

Turning now to FIGS. 2 and 3, details of the heat-conducting device 30 are shown. The device 30 includes a thermal plane 46 and a pair of feet 48 and 50. The CB 40 mounts onto the thermal plane 46, and is able to transfer to the thermal plane 46 heat generated by the electronic devices 42. The thermal plane 46 may be made of aluminum, .composite materials, or another suitable material with good thermal conductivity.

The thermal plane 46 has slots 54 and 56 therein, for receiving portions of the respective feet 48 and 50. As discussed further below, the feet 48 and 50 are movable relative to the thermal plane 46, so that the feet 48 and 50 may be positioned to achieve good contact between the heat-conducting device 30 and the airframe 12.

Further details are now discussed regarding one of the feet 50. It will be appreciated that there may be corresponding structures and mechanisms for the other foot 48. Indeed, the feet 48 and 50 may be substantially identical, and may be substantially diametrically opposed.

The foot 50 includes a slot engaging portion 60, which fits into the slot 56, and an airframe-engaging portion 62, for contacting and engaging the airframe 12. The slot-engaging portion 60 may be a substantially flat plate, with a hole 66 therein for engaging with a locking mechanism 70. The locking mechanism 70 is used for maintaining the foot 50 in a retracted position, for example before and during installation of the heat-conducting device 30. After the heat-conducting device 30 is installed within the missile 10, the locking mechanism 70 may be disengaged, to allow the foot 50 to extend and make contact with the airframe 12. A corresponding locking mechanism 72 may be provided for the foot 48.

The airframe-engaging portion 62 of the foot 50 has an airframe-contacting outer surface 74. The airframe-contacting outer surface 74 may have a rounded shape corresponding to the shape of the portion of the airframe 12 which it is to contact. The airframe-engaging portion 62 also includes a spring-contacting inner surface 76, which is configured to maintain contact with resilient devices such as springs 78 and 80. The springs 78 and 80 provide a force to move the foot 50 outward away from the thermal plane 46, which causes the outer surface 74 of the airframe-engaging portion 62 to position itself in contact with the airframe 12. The foot 50 floats within the slot 56. The resilient forces of the spring 78 and 80 allow the foot 50 to position itself relative to the thermal plane 46 to achieve a good contact between the heat-conducting device 30 and the airframe 12.

Thus through the actions of the springs the foot 50 may be self-positioning relative to the thermal plane 46, in two dimensions. One way of describing these two dimensions is that first, the foot 50 may translate outward and inward relative to the thermal plane 46, with the airframe-engaging portion 62 moving toward or away from the thermal plane 46. In addition, the foot 50 may rotate relative to the thermal plane 46, that is, with the airframe-engaging portion 62 moving relative to the thermal plane 46 without generally increasing or decreasing distance from the thermal plane 46.

The foot 50 may be made of aluminum, composite material, or other suitable heat-conducting materials. The foot 50 may be made from a single piece of material, for example, by machining.

The thickness of the slot-engaging portion 60 of the foot 50 may be close to the thickness of the slot 56, such that any air gap between the slot-engaging portion 60 and the thermal plane 46 is small enough so as to provide acceptable heat transfer between the thermal plane 46 and the foot 50. For example, the total gap 46 within the slot 56 between the portion 60 and the thermal plane may be less than about 0.13 mm (0.005 inches). Alternatively, the gap may be less than about 0.08 mm (0.003 inches). It will be appreciated that other sizes of gaps may be utilized. Further, it will be appreciated that part or all of the gap between the slot-engaging portion 60 and the thermal plane 46 may be filled by a suitable material, such as a thermal grease, to increase thermal conductivity without causing an unacceptable amount of friction.

It will be appreciated that other resilient devices may be used in place of the springs 78 and 80 described above. A wide variety of suitable configurations, including a variety of type and number of resilient devices may be used. The springs 78 and 80 may fit into openings in a protrusion 90 at a suitable location on the thermal plane 46. Springs 92 and 94 for extending and positioning the foot 48 may be mounted in a protrusion 96 on an opposite side of the thermal plane 46. An example of a suitable force for the springs is 40 pounds. The extension of the springs 78 and 80, and of the foot 50 may be from about 0.8 to about 1.0 mm (0.03 to 0.04 inches). Alternatively, the feet 48 and 50 may extend a larger amount, for example, for up to about 2.5 mm (0.1 inches) or more. However, it will be appreciated that these figures are merely examples, and that other configurations may be utilized.

As illustrated, the airframe-engaging outer surfaces of the feet 48 and 50 have a considerable angular extent around the circumference of the device 30, for example greater than about 140 degrees.

The locking mechanisms 70 and 72 may include cams or other devices for releasably holding the feet 48 and 50 in a retracted position. For example, the locking mechanisms 70 and 72 may have cams that may be rotated to engage holes in the slot-engaging portions (such as the hole 66 and the slot-engaging portion 60) to prevent movement of the feet 48 and 50. As noted above, the locking mechanisms 70 and 72 may be disengaged after the heat-conducting device 30 is loaded into the missile 10. The locking devices 70 and 72 may be releasable or disengagable by manipulation using a suitable tool, such as a screwdriver or Allen wrench. The heat-conducting devices 30 within the missile 10 may be configured such that the locking mechanisms of multiple devices may be disengaged substantially simultaneously. An example of a mechanism for simultaneously manipulating or reconfiguring several devices at once is illustrated in U.S. Pat. No. 6,351,383, which is hereby incorporated by reference in its entirety.

Turning now to FIG. 4, a high-level flowchart is shown of some steps of the method 100 for transferring heat from electronic devices 42 to the airframe 12 of the missile 10. In step 102, the circuit board 40 with the electronic devices 42 thereupon is coupled to the thermal plane 46 of a heat-conducting device 30. In step 104, the heat-conducting device 30 is loaded into an appropriate opening within the missile 10. As described above, locking mechanisms are utilized to keep the feet 48 and 50 of the heat-conducting device 30 retracted during this step. After installation, in step 108, the locking mechanisms 70 and 72 are released, causing the outer portions of the feet 48 and 50 to position themselves in contact with the airframe 12, due to the action of the resilient devices such as the springs.

The heat-conducting device 30 described above provides advantages with regard to other devices in the prior art. The feet 48 and 50 position themselves automatically and in good contact with the airframe 12. The springs maintain the feet 48 and 50 in contact with the airframe 12 without any need for adjustment by an operator or other user of the system. The feet 48 and 50 are able to extend and/or rotate to take up gross tolerances and gross angular misalignments between the device 30 and the airframe 12. The device 30 may be utilized with airframes built with current techniques and tolerances. The possibility of conductive debris is greatly reduced if not altogether ameliorated, as compared with devices using conductive fibers. Warping or changes in dimensions of the airframe 12 are automatically compensated for by the device 30 due to the use of the resilient devices such as the springs.

It will be appreciated that the invention is not limited to the illustrated configurations. For example, a greater or lesser number of feet than that shown may be utilized. Also, the heat-conducting device may have a different configuration than that shown.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A heat-conducting device for providing a thermal path between a circuit board and an airframe, the device comprising:
    a thermal plane able to receive a circuit board; and
    a foot partially protruding from the thermal plane;
    wherein the thermal plane has a slot therein for receiving a slot-engaging portion of the foot; and
    wherein the foot is movable relative to the thermal plane, to thereby provide better contact between the foot and the airframe.

2. The device of claim 1, further comprising at least one resilient device between the thermal plane and an airframe-engaging portion of the foot.

3. The device of claim 2, wherein the at least one resilient device includes at least one spring biased to provide a force directing the airframe-engaging portion outward, away from the thermal plane and toward the airframe.

4. The device of claim 2, wherein the foot is movable in at least two dimensions relative to the thermal plane, including:
    translation relative to the thermal plane, with the airframe-engaging portion movable toward and away from the thermal plane; and
    rotation relative to the thermal plane, with the airframe-engaging portion maintaining substantially the same distance from the thermal plane.

5. The device of claim 4, wherein the at least one resilient device enables self-adjustment of the foot due to misalignments of the device relative to the airframe.

6. The device of claim 1, further comprising a releasable locking mechanism preventing movement of the foot relative to the thermal plane.

7. The device of claim 6, wherein the locking mechanism maintains the foot in a retracted position.

8. The device of claim 1, wherein a total gap between the slot-engaging portion of the foot and sides of the slot is less than about 0.13 mm.

9. The device of claim 1, further comprising a thermally-conducting paste in a gap within the slot between the slot-engaging portion of the foot and sides of the slot.

10. The device of claim 1,
    further comprising another foot partially protruding from the thermal plane;
    wherein the thermal plane has another slot therein for receiving a slot-engaging portion of the another foot; and
    wherein the foot is movable relative to the thermal plane, to thereby provide better contact between the foot and the airframe.

11. The device of claim 10, wherein the feet are substantially diametrically opposed from one another.

12. The device of claim 1, wherein the thermal plane is made of aluminum.

13. The device of claim 1, wherein the foot is made of aluminum.

14. The device of claim 1, wherein the foot is not connected to the thermal plane.

15. A heat-conducting device for providing a thermal path between a circuit board and an airframe, the device comprising:
    a thermal plane able to receive a circuit board;
    a pair of feet partially protruding from the thermal plane; and
    resilient devices between the thermal plane and airframe-engaging portions of respective of the feet;

wherein the thermal plane has slots therein for receiving respective slot-engaging portions of the feet; and wherein the feet are movable relative to the thermal plane, to thereby provide better contact between the airframe-engaging portions and the airframe.

16. The device of claim 15, wherein the resilient devices each include at least one spring biased to provide a force directing the airframe-engaging portion outward, away from the thermal plane and toward the airframe.

17. The device of claim 15, wherein the feet are movable in at least two dimensions relative to the thermal plane, including:

translation relative to the thermal plane, with the airframe-engaging portions movable toward and away from the thermal plane; and rotation relative to the thermal plane, with the airframe-engaging portions maintaining substantially the same distance from the thermal plane.

18. The device of claim 15, wherein the feet are substantially diametrically opposed from one another.

19. A method of transferring heat from a circuit board to an airframe of a missile, the method comprising:

placing in the missile a heat-conducting device that includes a thermal plane to which the circuit board is attached; and following the placing, contacting the airframe with feet of the heat-conducting device, wherein the feet are thermally coupled to the thermal plane;

wherein the contacting includes using resilient devices of the heat-conducting device to push the feet against the airframe.

20. The method of claim 19, wherein, during the contacting, slot-engaging portions of the feet are freely floating within respective slots of thermal plane.

* * * * *